(12) United States Patent
Michaelis et al.

(10) Patent No.: US 11,705,370 B2
(45) Date of Patent: Jul. 18, 2023

(54) SEMICONDUCTOR COMPONENT HAVING A COMPRESSIVE STRAIN LAYER AND METHOD FOR PRODUCING THE SEMICONDUCTOR COMPONENT HAVING A COMPRESSIVE STRAIN LAYER

(71) Applicant: OSRAM OLED GmbH, Regensburg (DE)

(72) Inventors: Benjamin Michaelis, Regensburg (DE); Markus Broell, Hamburg (DE); Robert Walter, Parsberg (DE); Franz Eberhard, Kilchberg (CH); Michael Huber, Bad Abbach (DE); Wolfgang Schmid, Gundelshausen (DE)

(73) Assignee: OSRAM OLED GmbH, Regensburg (DE)

( * ) Notice: Subject to any disclaimer, the term of this patent is extended or adjusted under 35 U.S.C. 154(b) by 30 days.

(21) Appl. No.: 17/255,435

(22) PCT Filed: Jun. 27, 2019

(86) PCT No.: PCT/EP2019/067183
§ 371 (c)(1),
(2) Date: Dec. 23, 2020

(87) PCT Pub. No.: WO2020/002514
PCT Pub. Date: Jan. 2, 2020

(65) Prior Publication Data
US 2021/0265213 A1    Aug. 26, 2021

(30) Foreign Application Priority Data
Jun. 28, 2018    (DE) ..................... 10 2018 115 594.8

(51) Int. Cl.
*H01L 21/78*    (2006.01)
*H01L 33/00*    (2010.01)
(Continued)

(52) U.S. Cl.
CPC .............. *H01L 21/78* (2013.01); *H01L 23/50* (2013.01); *H01L 24/94* (2013.01);
(Continued)

(58) Field of Classification Search
CPC ..... H01L 21/78; H01L 33/0093; H01L 23/50; H01L 24/94; H01L 31/02002;
(Continued)

(56) References Cited

U.S. PATENT DOCUMENTS

2011/0175056 A1    7/2011    Cho et al.
2013/0059236 A1*   3/2013    Shishido ............. C03C 17/3435
                                                                  428/432
(Continued)

FOREIGN PATENT DOCUMENTS

EP    2368963 A2    9/2011
WO    2006043796 A1    4/2006

*Primary Examiner* — Fernando L Toledo
*Assistant Examiner* — Neil R Prasad
(74) *Attorney, Agent, or Firm* — Viering, Jentschura & Partner mbB (57) ABSTRACT

A semiconductor component may include a first compressive strain layer on top of a semiconductor body. A material for the first compressive strain layer may include Ta, Mo, Nb, compounds thereof, and combinations thereof.

20 Claims, 7 Drawing Sheets

(51) Int. Cl.

| | |
|---|---|
| *H01L 23/50* | (2006.01) |
| *H01L 23/00* | (2006.01) |
| *H01L 31/02* | (2006.01) |
| *H01L 31/0216* | (2014.01) |
| *H01L 31/18* | (2006.01) |
| *H01L 33/44* | (2010.01) |
| *H01L 33/62* | (2010.01) |

(52) U.S. Cl.
CPC .... *H01L 31/02002* (2013.01); *H01L 31/0216* (2013.01); *H01L 31/186* (2013.01); *H01L 33/0093* (2020.05); *H01L 33/0095* (2013.01); *H01L 33/44* (2013.01); *H01L 33/62* (2013.01); *H01L 24/32* (2013.01); *H01L 24/83* (2013.01); *H01L 2224/32225* (2013.01); *H01L 2224/83192* (2013.01); *H01L 2224/83801* (2013.01)

(58) Field of Classification Search
CPC ............... H01L 31/0216; H01L 31/186; H01L 33/0095; H01L 33/44; H01L 33/62; H01L 24/32; H01L 24/83; H01L 2224/32225; H01L 2224/83192; H01L 2224/83801
See application file for complete search history.

(56) References Cited

U.S. PATENT DOCUMENTS

| | | | |
|---|---|---|---|
| 2016/0064580 A1* | 3/2016 | Palm | C03C 17/3639 |
| | | | 136/256 |
| 2016/0240733 A1 | 8/2016 | Park et al. | |
| 2016/0268164 A1* | 9/2016 | Matsui | H01L 21/3065 |
| 2016/0372649 A1 | 12/2016 | Bernhardt et al. | |
| 2017/0186919 A1 | 6/2017 | Yoo | |

* cited by examiner

SEMICONDUCTOR COMPONENT HAVING A COMPRESSIVE STRAIN LAYER AND METHOD FOR PRODUCING THE SEMICONDUCTOR COMPONENT HAVING A COMPRESSIVE STRAIN LAYER

CROSS-REFERENCE TO RELATED APPLICATIONS

The present application is a national stage entry according to 35 U.S.C. § 371 of PCT application No.: PCT/EP2019/067183 filed on Jun. 27, 2019; which claims priority to German Patent Application Serial No.: 10 2018 115 594.8 filed on Jun. 28, 2018; all of which are incorporated herein by reference in their entirety and for all purposes.

TECHNICAL FIELD

The present disclosure pertains to semiconductor devices and methods of producing such devices having one or more compressively stressed layers.

BACKGROUND

The present patent application claims the priority of German patent application DE 10 2018 115 594.8, the disclosure contents of which are incorporated herein by reference.

In the production of semiconductor devices, the individual layers are usually applied over a wafer and structured, for example, using suitable processes. After processing the devices at wafer level, they are separated into semiconductor chips using suitable sawing methods.

For example, heterogeneous layer sequences are applied, for example by heteroepitaxy or by applying metallic, conductive, or insulating layers. This may generate stresses within the processed wafer. These stresses may lead to bowing of the wafer, which makes further processing more difficult.

Therefore concepts are being researched which may help to prevent or restrict the bowing of wafers during the production of semiconductor devices.

It is an object to provide an improved semiconductor device and an improved method of producing a semiconductor device.

According to embodiments, the object is achieved by the subject matter and the method of the independent claims.

SUMMARY

A semiconductor device comprises a first compressively stressed layer over a semiconductor body. A material of the first compressively stressed layer is selected from Ta, Mo, Nb, or from compounds of Ta, Mo, or Nb. For example, a compound of tantalum may be tantalum nitride or tantalum oxide.

A layer thickness of the first compressively stressed layer is 100 nm to 1.5 µm. The first compressively stressed layer extends up to an edge of the semiconductor device.

The semiconductor device may furthermore include a carrier, wherein a material of the first compressively stressed layer is an electrically conductive material and is suitable for establishing an electrical connection between components of the semiconductor device and the carrier. According to embodiments, a second compressively stressed layer may be arranged between the carrier and the first compressively stressed layer. The material of the first compressively stressed layer may be electrically conductive or insulating.

According to further embodiments, a material of the first compressively stressed layer may be an electrically conductive material. The semiconductor device may furthermore comprise circuit components which are arranged within or adjacent to the semiconductor body. The circuit components may be electrically connected to the first compressively stressed layer.

The semiconductor body may, for example, be suitable for generating or receiving electromagnetic radiation. The compressively stressed layer may act as a current spreading structure.

According to further embodiments, a material of the first compressively stressed layer may be an electrically insulating material. For example, the first compressively stressed layer may be suitable for insulating the semiconductor body from the carrier.

A method of producing a semiconductor device comprises applying a first compressively stressed layer over a workpiece which comprises a semiconductor body. A material of the first compressively stressed layer is selected from Ta, Mo, Nb, or compounds of Ta, Mo, or Nb. The method furthermore comprises separating the workpiece into individual semiconductor devices. For example, a layer thickness of the first compressively stressed layer is 100 nm to 1.5 µm.

The first compressively stressed layer may be applied extensively over the workpiece and, prior to separating the workpiece, may be present in edge regions of the individual semiconductor devices.

The method may further comprise applying the workpiece to a carrier. The material of the first compressively stressed layer may be electrically conductive material and may be suitable for providing an electrical connection between components of the semiconductor device and the carrier.

The method may further include applying the workpiece to a carrier, wherein a second compressively stressed layer is arranged over the carrier, and the workpiece and the carrier are joined together in such a manner that the first and second compressively stressed layers are arranged between the carrier and the workpiece.

The carrier may, for example, comprise or be composed from a conductive, insulating or semiconductor material. For example, the carrier may be insulating. For example, the carrier may comprise or consist of an insulating material such as silicon nitride in any stoichiometric ratios or a wide-bandgap semiconductor material, such as AlN, for example.

The compressively stressed layer may, for example, be applied by sputtering. A stress in the compressively stressed layer may be set by setting the sputtering rate.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and many of the intended advantages will become apparent directly from the following detailed description. The elements and structures shown in the drawings are not necessarily shown to scale relative to each another. Like reference numerals refer to like or corresponding elements and structures.

DETAILED DESCRIPTION

In the following detailed description, reference is made to the accompanying drawings, which form a part of the disclosure and in which specific exemplary embodiments are shown for illustrative purposes. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is merely used by way of explanation and is in no way intended to be limiting.

The description of the exemplary embodiments is not limiting, since there are also other exemplary embodiments and structural or logical changes may be made without deviating from the scope as defined by the claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure having a semiconductor surface. Wafer and structure are to be understood to include doped and undoped semiconductors, epitaxial semiconductor layers, supported by a base support, if applicable, and further semiconductor structures. For example, a layer of a first semiconductor material may be grown on a growth substrate made of a second semiconductor material or of an insulating material, for example on a sapphire substrate. Depending on the intended use, the semiconductor may be based on a direct or an indirect semiconductor material. Examples of semiconductor materials particularly suitable for generating electromagnetic radiation include, without limitation, nitride semiconductor compounds which may, for example, generate ultraviolet, blue or longer-wave light, such as GaN, InGaN, AlN, AlGaN, AlGaInN; phosphide semiconductor compounds, which may, for example, generate green or longer-wave light, such as GaAsP, AlGaInP, GaP, AlGaP; and other semiconductor materials such as AlGaAs, SiC, ZnSe, GaAs, ZnO, $Ga_2O_3$, diamond, hexagonal BN and combinations of the materials mentioned. The stoichiometric ratio of the ternary compounds may vary. Further examples of semiconductor materials may include silicon, silicon germanium, and germanium. In the context of the present description, the term "semiconductor" also includes organic semiconductor materials.

The terms "lateral" and "horizontal", as used in the present description, are intended to describe an orientation or alignment which extends substantially parallel to a first surface of a substrate or semiconductor body. This may, for example, be the surface of a wafer or a die or a chip.

In the context of the present application, the designation "over" in connection with applied layers refers to a distance from a base layer, for example a substrate, on which the individual layers are applied. For example, the feature that a first layer is arranged "over" a second layer means that the first layer is at a greater distance from the base layer than the second layer.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements do not necessarily need to be directly connected to one another. Further elements may be arranged between electrically connected elements.

The term "electrically connected" also includes tunnel contacts between the connected elements.

In the context of the present description, in particular layers are described which exhibit stress, for example tensile or compressive stress. In general, stress may be positive or negative, i.e. may be a tensile or a compressive stress. In the context of the present description, stress refers to stress which leads to a bowing of the associated substrate material, for example a test wafer, when a corresponding layer is applied to the substrate material. In the case of tensile stress, the substrate material with the layer applied takes on a bowl-like or concave shape. In the case of compressive stress, the substrate material with the layer applied takes on a convex shape.

Figure 1:
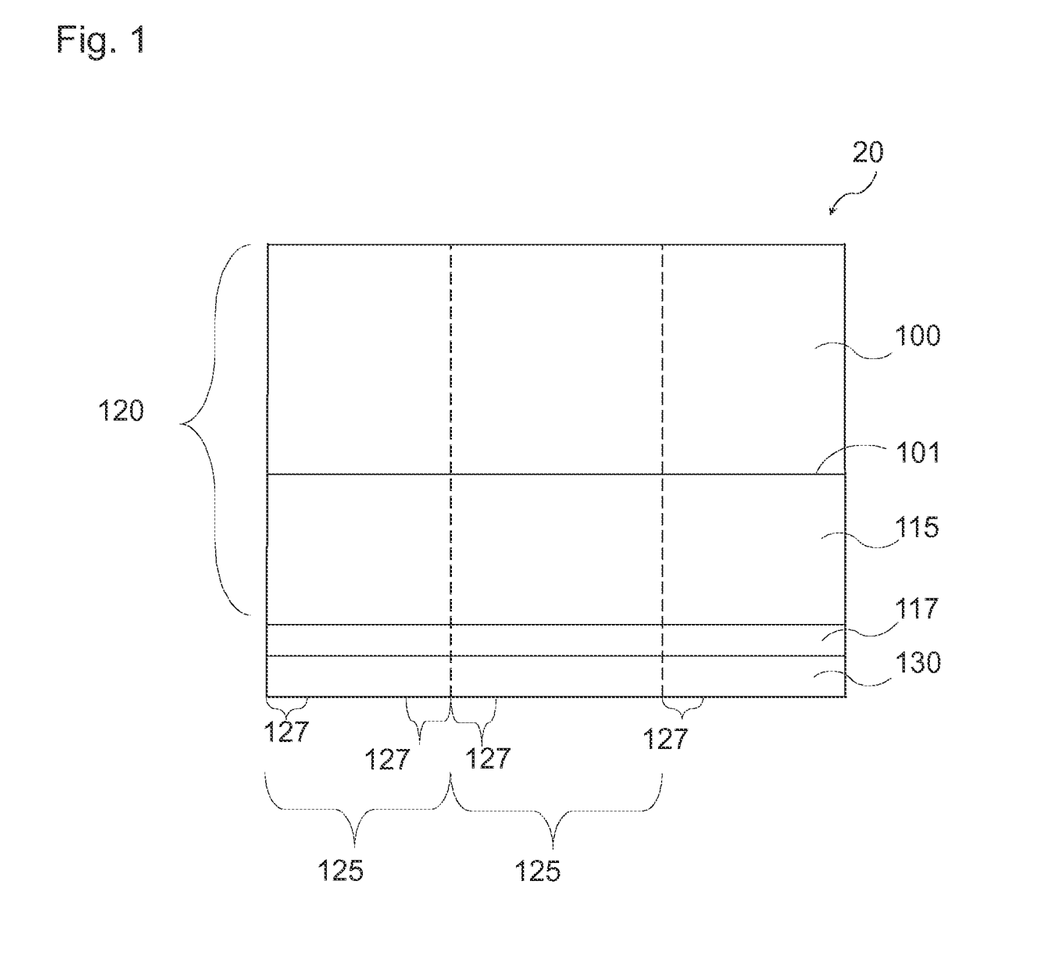
FIG. 1 shows a schematic cross-sectional view of a workpiece.

FIG. 1 shows a workpiece 20 during production of semiconductor devices according to embodiments. The workpiece 20 comprises a semiconductor body 120. For example, the semiconductor body 120 comprises a substrate 100 and a semiconductor layer stack 115 applied over a first main surface 101 of the substrate 100. The substrate 100 may, for example, be an insulating substrate or a semiconductor substrate or a conductive substrate. For example, the substrate 100 may be a growth substrate on which the stack of layers 115 may be grown epitaxially. The semiconductor layer stack 115 may include one or more layers of any of the aforementioned semiconductor materials. The semiconductor layers may be doped in a suitable manner in order to ensure the desired functionality of the semiconductor device.

The workpiece 20 further comprises a first compressively stressed layer 130 over the semiconductor body 120. A material of the first compressively stressed layer 130 is selected from Ta, Mo, Nb, or compounds of Ta, Mo or Nb. For example, the material of the first compressively stressed layer 130 may also include a tantalum alloy, for example with nickel, or a molybdenum or niobium alloy. A layer thickness of the first compressively stressed layer may, for example, be less than 1.5 µm or less than 1.0 µm. For example, a layer thickness of the first compressively stressed layer may be greater than 100 nm. According to further embodiments, the layer thickness of the first compressively stressed layer 130 may be less than 500 nm. Examples of the material of the first compressively stressed layer 130 may include Ta, Mo, Nb, or a binary compound of these materials, for example MoNb, MoTa, NbO, TaN and others. According to further embodiments, the material of the first compressively stressed layer 130 may be an oxide or nitride of Ta, Mo or Nb. For example, the oxide or nitride may have any stoichiometric composition. As will be explained below, the oxide or nitride of Ta, Mo or Nb may be produced, for example, by heating a workpiece in a nitrogen or oxide or oxygen-containing atmosphere. For example, an intermediate layer 117 may be arranged between the semiconductor layer stack 115 and the first compressively stressed layer 130.

As shown in FIG. 1, the layers may, for example, be applied at the wafer level, i.e. the workpiece 20 is part of a wafer with layers applied. By arranging the first compressively stressed layer 130 over the semiconductor body 120, tensile stresses, for example, which result from applying a metallization, may be compensated for. It has also been shown that the first compressively stressed layer 130 made of the materials mentioned is very corrosion-resistant.

The first compressively stressed layer 130 may be insulating or conductive. If it is conductive, it may, for example, be suitable for establishing an electrical connection between elements, for example within the semiconductor device or also outside the same. However, the first compressively stressed layer 130 may be conductive, without establishing an electrical connection between elements.

After applying and structuring the respective layers, the workpiece 20 or the processed wafer may be separated into individual semiconductor chips 125, for example by sawing or other separation processes. This separation usually takes place in an edge region 127 of the associated semiconductor chips 125. For example, components of the semiconductor devices may not be present in the edge region 127 in order to prevent them from being damaged by the separation process. In general, this edge region is also referred to as the sawing edge or kerf 127.

For example, a plasma separation method may be used. It has been shown that compressively stressed layers made of Ta, Mo, Nb, or binary compounds of these materials, for example MoNb, MoTa, NbO, TaN and others, are not affected by a fluorine plasma or other aggressive materials. In particular in the presence of catalyzer materials such as gold in its vicinity, a compressively stressed layer made of the materials mentioned is not susceptible to corrosion caused by moisture. In particular, it has been shown that the compressively stressed layer made of the materials may also be present in the edge region 127 of the semiconductor chips 125 or the semiconductor devices 10, 15 without corrosion taking place. Correspondingly, the compressively stressed layer 130 may be applied extensively over the entire surface of the wafer 100 processed, i.e. also in the edge region 127. The compressively stressed material may be applied in any thickness, as a result of which the bowing of the wafer due to existing compressively stressed layers may be specifically reduced or may also be set to occur in the opposite direction. For example, a stress may be in a range from −20 MPa to −2000 MPa or −200 MPa to −1000 MPa.

Figure 2A:
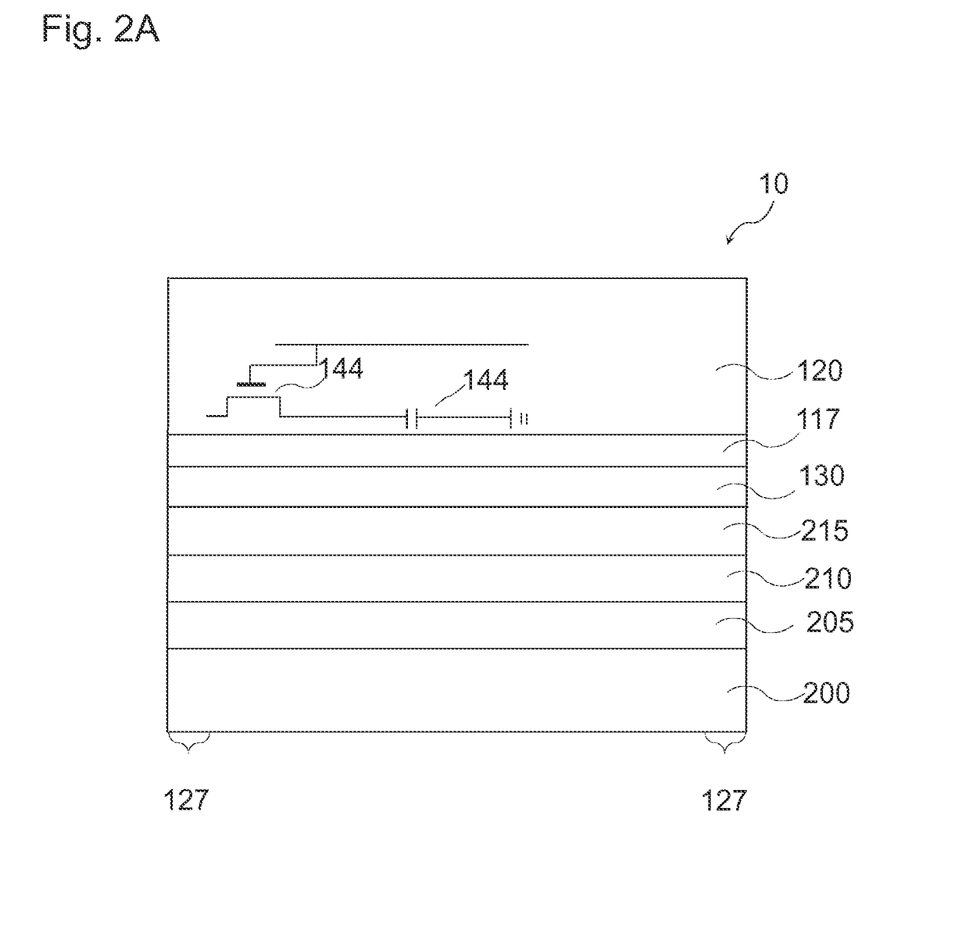
FIG. 2A shows a schematic cross-sectional view of a semiconductor device in accordance with embodiments.

FIG. 2A shows a semiconductor device 10 according to embodiments. For example, the semiconductor body 120 may also include differently doped semiconductor regions, for example silicon regions. Insulating layers and conductive layers may be arranged in a structured manner in or on the semiconductor body 120. For example, circuit components 144 may be arranged in the semiconductor body 120. The circuit components 144 may, for example, comprise doped regions, conductive regions or insulating regions that are suitably structured. Examples of circuit components include passive and active devices, such as transistors, capacitors, resistance devices and others. The circuit components 44 may also include sensors or light emitting devices and others.

An intermediate layer 117 may be applied over the semiconductor body 120. The intermediate layer 117 may be an insulating layer, for example. The intermediate layer 117 may, for example, be structured. Depending on the configuration of the semiconductor device 10, the intermediate layer 117 may also be omitted. A first compressively stressed layer 130 is arranged over the intermediate layer 117 and over the semiconductor body 120. A material of the compressively stressed layer is selected from Ta, Mo, Nb, or from compounds of Ta, Mo or Nb. For example, the material of the first compressively stressed layer 130 may be tantalum or may have a composition as discussed above. The first compressively stressed layer 130 has a layer thickness of 100 to 1500 nm. For example, it may be 100 to 500 nm.

The semiconductor device 10 may furthermore comprise a carrier 200, for example made of a conductive, insulating or semiconductor material. A second compressively stressed layer 210 may be applied over the carrier 200. For example, the second compressively stressed layer 210 may contain the same material as the first compressively stressed layer 130. The carrier 200 having the second compressively stressed layer may furthermore be connected to the first compressively stressed layer 130 via a solder layer 215. For example, circuit components 144 of the semiconductor device may be electrically connected via the first compressively stressed layer 130, the solder layer 215 and the second compressively stressed layer 210. The solder layer may, for example, include AuSn, AuInSn, NiInSn, NiSn, and optionally barrier and adhesive layers made of, e.g., Pt and Ti. For example, the solder layer 215 may have a layer thickness of more than 2 µm. The layer thickness of the solder layer may be less than 5 µm, for example.

FIG. 2A shows an already separated semiconductor chip. In the edge region 127, in which no circuit components 144 are arranged, a part of the first compressively stressed layer 130 is also arranged. The first compressively stressed layer 130 is thus applied in an extensive manner.

Figure 2B:
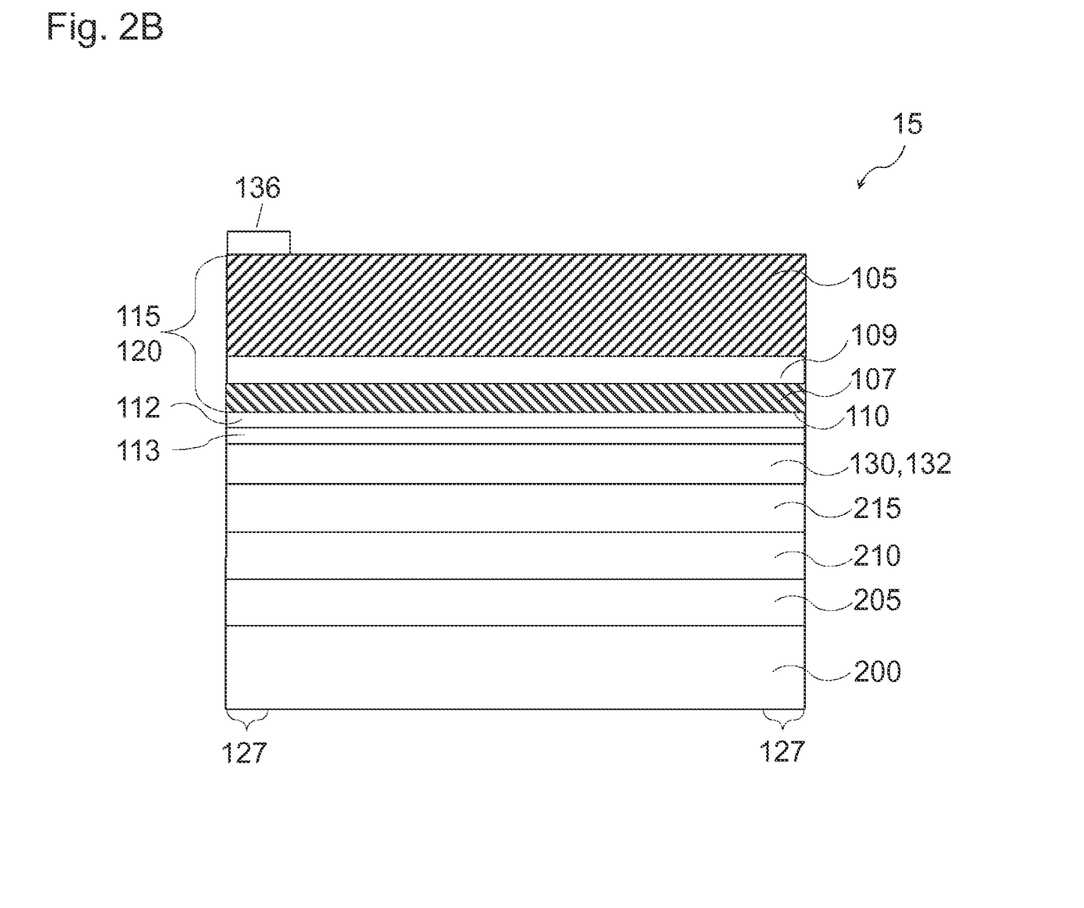
FIG. 2B shows a schematic cross-sectional view of a semiconductor device in accordance with embodiments.

FIG. 2B shows an optoelectronic semiconductor device 15 in accordance with embodiments. The optoelectronic semiconductor device 15 may be a thin-film LED, for example. The semiconductor layer stack 115 of the optoelectronic semiconductor chip comprises, for example, a first semiconductor layer 105 of a first conductivity type, for example n-type. The semiconductor layer stack 115 furthermore comprises a second semiconductor layer 107 of a second conductivity type, for example p-type. An active region 109 may be arranged between the first and second semiconductor layers 105, 107. For example, the active area 109 comprises a p-n junction, a double heterostructure, a single quantum well (SQW) or a multi-quantum well structure (MQW) for generating radiation. The term "quantum well structure" does not imply any particular meaning here with regard to the dimensionality of the quantization. Therefore it includes, among other things, quantum wells, quantum wires and quantum dots as well as any combination of these structures.

A mirror layer 112 may, for example, be arranged adjacent to the first main surface 110 of the semiconductor layer stack 115. For example, the mirror layer 112 may be a dielectric mirror layer. An intermediate layer 113 may be arranged adjacent to the dielectric mirror layer 112. A material of the intermediate layer 113 may, for example, be insulating or conductive, the intermediate layer 113 may, for example, include a transparent conductive material such as indium tin oxide (ITO). The intermediate layer 113 may also be omitted. A conductive first compressively stressed layer 130, 132 is arranged adjacent to the mirror layer 112 or the intermediate layer 113.

The optoelectronic semiconductor device 15 furthermore comprises a carrier made of, e.g., a conductive, insulating or semiconductor material. A second compressively stressed layer 210 may be arranged over the carrier 200. According to further embodiments, however, the second compressively stressed layer 210 may also be omitted. For example, the second compressively stressed layer 210 may be connected to the first compressively stressed layer 130 via a solder layer 215 made, for example, of the aforementioned materials.

According to embodiments, the first compressively stressed layer may on the one hand reduce wafer bowing due to existing tensile-stressed layers or adjust the wafer bowing in the opposite direction. Furthermore, if the compressively stressed layer 130 is a conductive compressively stressed layer 132, it may act as a current spreading structure and may, in particular, effect electrical contact with the second semiconductor layer 107. For example, the dielectric mirror layer 112 may be discontinuous in sections or in parts, such that direct electrical contact is produced between the compressively stressed layer 130 and the second semiconductor layer 107. The optoelectronic semiconductor device may represent a thin-film LED, for example. The optoelectronic semiconductor device 15 may furthermore include a first contact area 136, which is in contact with the first semiconductor layer 105. For example, the first contact area 136 may be arranged adjacent to a first main surface 106 of the first semiconductor layer 105. The optoelectronic device 15 furthermore includes an edge region 127. The first and second compressively stressed layers 130, 210 each extend up to the edge region 127. Owing to the corrosion resistance of the material of the compressively stressed layer 130, it may be applied extensively up to the chip edge that is susceptible to moisture. Accordingly, it is not necessary to structure the first compressively stressed layer 130 by photolithography, for example, in such a manner that each of the edge regions 127 is free of the compressively stressed layer 130.

Figure 2C:
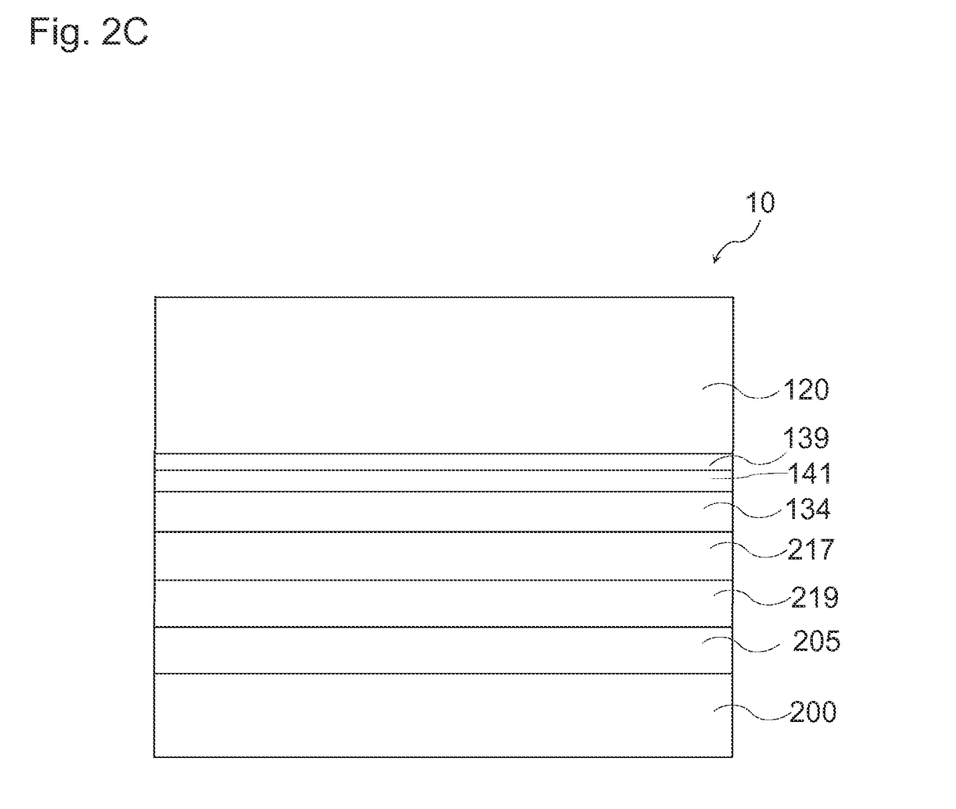
FIG. 2C shows a schematic cross-sectional view of a semiconductor device in accordance with embodiments.

FIG. 2C shows a semiconductor device 10 in accordance with further embodiments. According to these embodiments and diverging from the embodiments previously described, the first compressively stressed layer 134 is composed from an insulating material, for example NbO. Accordingly, it may be used, for example, as part of an insulation layer in addition to its effect as a stress compensating layer. The semiconductor device 10 comprises a semiconductor layer stack 115 which may, for example, comprise various doped layers or just one uniform semiconductor body. In the semiconductor body 120 any desired components of semiconductor devices, for example circuit components 144 as discussed above or others, may be arranged. For example, an insulating layer 139 may be arranged over the semiconductor body 120. Furthermore, a contact layer 141 may, for example, be arranged over the insulating layer 139. The contact layer 141 may, for example, be suitable for connecting components of the semiconductor device 10 to external connections. An insulating compressively stressed layer 134 is applied over the conductive contact layer 141. For example, a material of the insulating compressively stressed layer may comprise TaN, NbO or others. The semiconductor device 10 furthermore comprises a carrier made of an insulating, conductive or semiconductor material 200. A second compressively stressed layer 219 is arranged over the carrier 200. For example, a suitable intermediate layer 205 may be arranged between the second compressively stressed layer 219 and the carrier. The second compressively stressed layer may be conductive or insulating, for example. The second compressively stressed layer 219 is connected to the first compressively stressed layer 134 via an adhesive layer 217, for example. According to the embodiments shown in FIG. 2C, the compressively stressed layer 134 may in this case at the same time be used as part of an insulation layer for electrical insulation between conducting layers, for example the contact layer 141 and the carrier 200.

According to further modifications, the electrical contact may also be made via the solder layer 215 and/or via the carrier 200.

Figure 3:
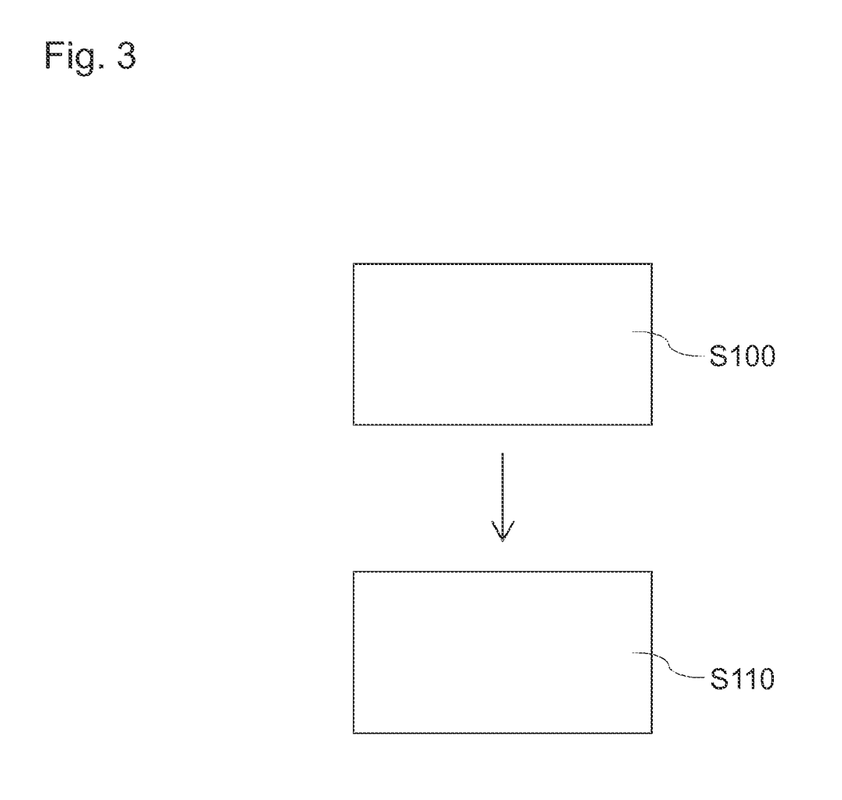
FIG. 3 outlines a method according to embodiments.

FIG. 3 illustrates a method according to embodiments. A method of producing a semiconductor device 10, 15 comprises applying (S100) a first compressively stressed layer 130 over a workpiece comprising a semiconductor body 120. A material of the first compressive stressed layer is selected from Ta, Mo, Nb, or compounds of Ta, Mo or Nb. The method further comprises separating (S110) the workpiece 20 into individual semiconductor devices 10, 15 after application of the first compressively stressed layer.

For example, the compressively stressed layer 130 may be applied by sputtering. For example, the compressive stress may be varied by adjusting the sputtering rate. The compressive stress may be increased by fast sputtering or a high sputtering rate. Conductive compressively stressed layers 130, 132, 210 may be produced, for example, by sputtering metal layers.

For example, the production of insulating compressively stressed layers 134 may include sputtering a corresponding metal layer, for example Ta, Mo, Nb. The wafer is then baked in nitrogen or oxygen, such that an insulating oxide or nitride is produced.

Figure 4A:
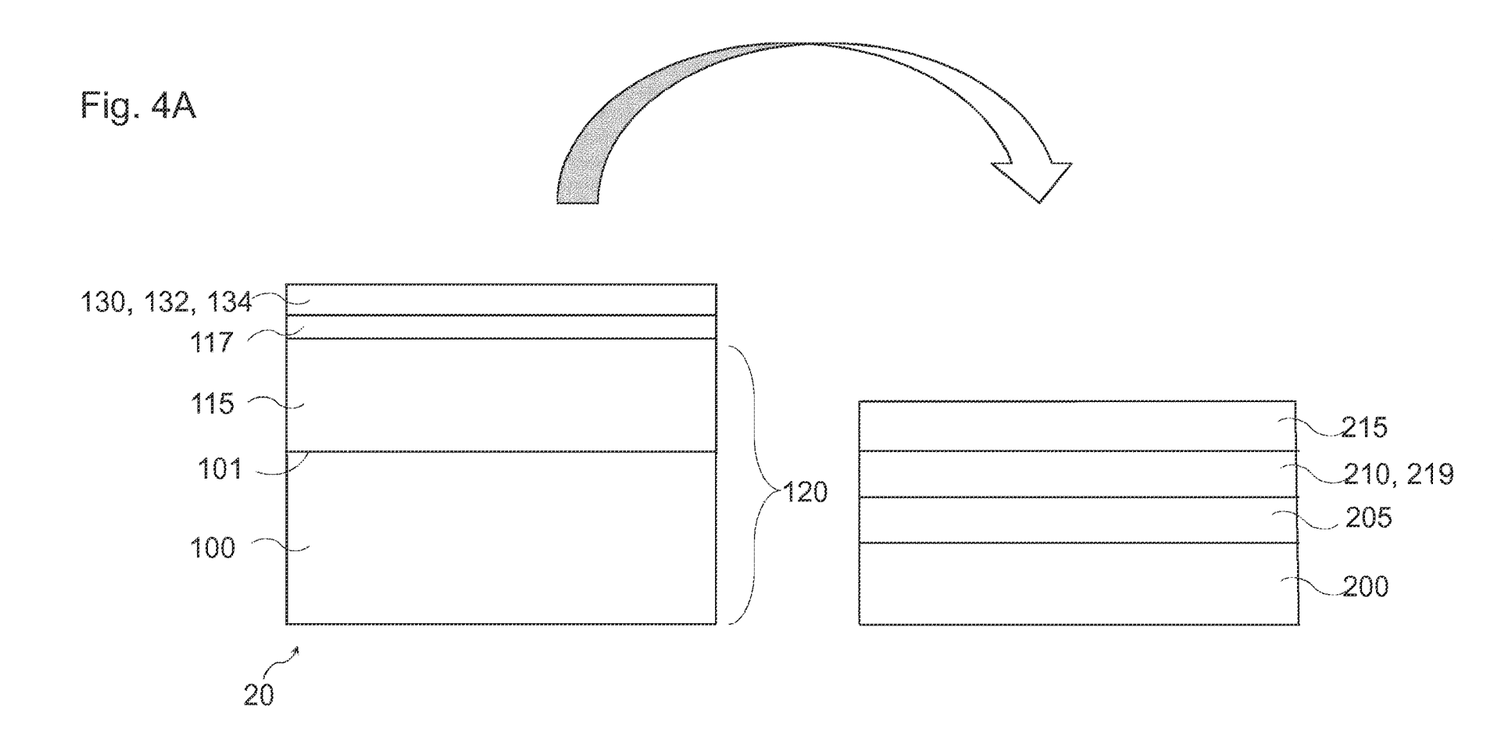
FIGS. 4A and 4B illustrate a method of manufacturing a semiconductor device in accordance with embodiments.
Figure 4B:
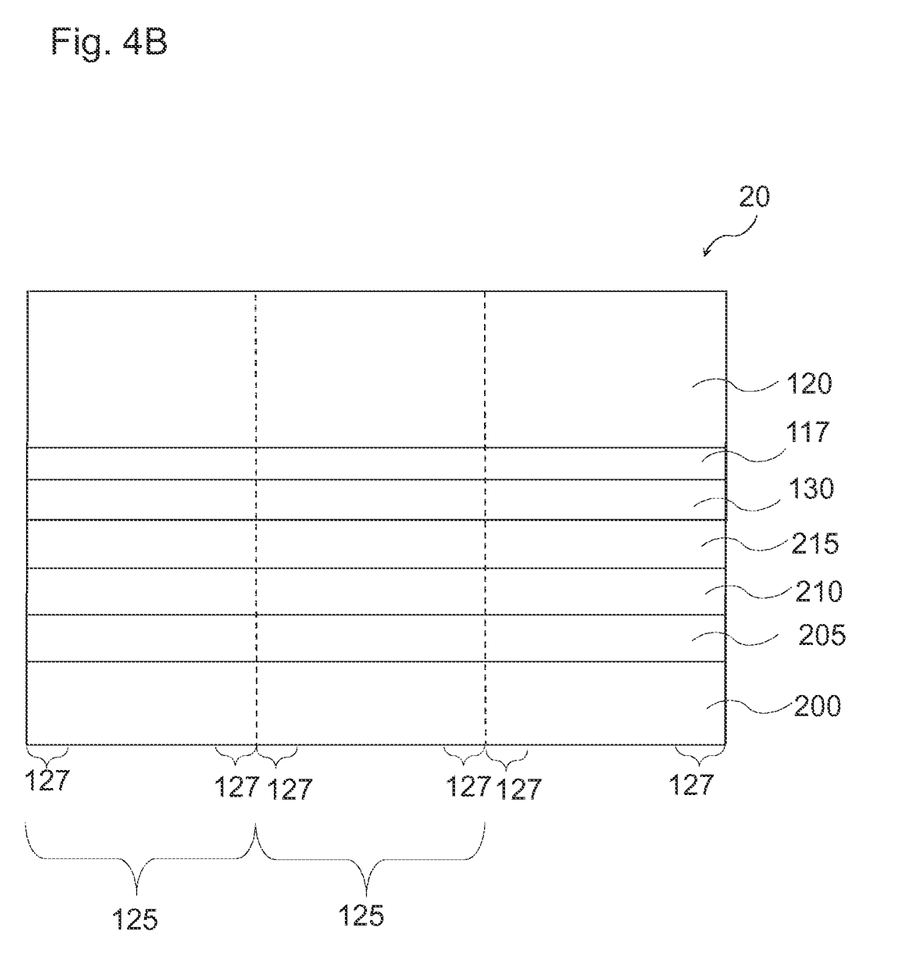

FIGS. 4A and 4B illustrate an example in which a workpiece 20 having a compressively stressed layer 130, 132, 134 is joined to a carrier 200. A semiconductor layer stack 115 and optionally one or more suitable intermediate layers 117 are arranged between a substrate 100 and the compressively stressed layer 130, 132, 134.

A second compressively stressed layer 210, 219 is applied over a suitable carrier 200. One or more intermediate layers 205 may be arranged between the second compressively stressed layer 210, 219 and the carrier. The second compressively stressed layer 210, 219 may be composed from the same materials as the first compressively stressed layer 130, 132, 134. The carrier 200 having the applied compressively stressed layer 210, 219 and the semiconductor body having the applied compressively stressed layer 130, 132, 134 are then joined together. The joining may, for example, be effected through a solder layer 215. Alternatively, the joining may also be effected through a suitable adhesive layer, for example if the compressively stressed layers are each insulating. According to further embodiments, the second compressively stressed layer 210, 219 may also be omitted.

The method described may be carried out at the wafer level. FIG. 4B shows an example of a resulting workpiece 20.

According to further embodiments, the sputtered material may be baked or annealed in a vacuum or exposed to a gas mixture containing nitrogen or oxide. For example, the sputtered material may react to form a corrosion-resistant compound when it is exposed to a nitrogen or oxide-containing gas mixture. For example, tantalum may react to form tantalum oxide or tantalum nitride. The stoichiometric ratio of the tantalum oxide or tantalum nitride may be adjusted according to the reaction conditions.

The compressive stress of the material may be further influenced by a temperature treatment step. More precisely, the bowing of the wafer may be adjusted even at a later point in the processing, such that a desired bowing of the wafer may be achieved.

The workpiece is then separated into the individual chips 125, as indicated also in FIG. 4B. For example, a plasma dicing process may be carried out using the Bosch method, for example. As the material of the compressively stressed layer is corrosion-resistant, its material will not decompose during a plasma dicing process. For example, the material of the compressively stressed layers, for example Ta, Mo, Nb, or compounds of Ta, Mo or Nb, is resistant, for example even in the presence of fluorine gases or fluoropolymers. Correspondingly, the materials of the compressively stressed layer may be applied extensively, and it is not necessary to structure the applied compressively stressed layer.

As the wafer bowing is compensated for by the application of the compressively stressed layer, it is not necessary to use a carrier 200 of great thickness which would counteract this bowing. Correspondingly, the thickness of the carrier 200 may be further reduced, for example to a thickness of less than 120 µm, for example to as little as 40 µm, which causes the thermal resistance of the device to decrease.

Although specific embodiments have been illustrated and described herein, those skilled in the art will recognize that the specific embodiments shown and described may be replaced by a multiplicity of alternative and/or equivalent configurations without departing from the scope of the claims. The application is intended to cover any adaptations or variations of the specific embodiments discussed herein. Therefore, the invention is to be limited by the claims and their equivalents only.

LIST OF REFERENCES 10 semiconductor device
15 optoelectronic semiconductor device
20 workpiece
100 substrate
101 first main surface of the substrate
105 first semiconductor layer
106 first main surface of the first semiconductor layer
107 second semiconductor layer
109 active zone
110 first main surface of the semiconductor layer stack
112 mirror layer
113 intermediate layer
115 semiconductor layer stack
117 intermediate layer
120 semiconductor body
125 semiconductor chip
127 edge area
130 first compressively stressed layer
132 conductive compressively stressed layer
134 insulating compressively stressed layer
136 first contact pad
139 insulating layer
141 contact layer
144 circuit component
200 carrier
205 intermediate layer
210 second compressively stressed layer
215 solder layer
217 adhesive layer
219 second compressively stressed layer

The invention claimed is:

1. A method of producing a semiconductor device comprising:
 forming at least one semiconductor layer over a growth substrate to form a semiconductor body;
 thereafter applying a first compressively stressed layer over the semiconductor body to form a workpiece;
 wherein the first compressively stressed layer comprises a material selected from tantalum, molybdenum, niobium, compounds, or combinations thereof;
 thereafter applying the workpiece to a carrier; so that the first compressively stressed layer is arranged between the semiconductor body and the carrier; and
 separating the workpiece into individual semiconductor devices.

2. The method according to claim 1, wherein the first compressively stressed layer has a thickness ranging from 100 nm to 1.5 µm.

3. The method according to claim 1, further comprising applying the first compressively stressed layer over the workpiece, and wherein the first compressively stressed layer is present in edge regions of the individual semiconductor devices prior to separating the workpiece.

4. The method according to claim 1, further comprising applying the workpiece to the carrier; wherein the material of the first compressively stressed layer is an electrically conductive material, and wherein the material is configured to provide an electrical connection of components of the semiconductor device to the carrier.

5. The method according to claim 1, wherein the carrier is an insulating carrier.

6. The method according to claim 1 wherein a second compressively stressed layer is arranged over the carrier, and wherein the workpiece and the carrier are joined together in such a manner that the first and second compressively stressed layers are arranged between the carrier and the workpiece.

7. The method according to claim 1, wherein the compressively stressed layer is applied by sputtering.

8. The method according to claim 7, wherein setting the sputtering rate sets a stress in the compressively stressed layer.

9. A semiconductor device comprising:
 a semiconductor body comprising a growth substrate and at least one semiconductor layer over the growth substrate;
 a first compressively stressed layer over the semiconductor body, a material of the first compressively stressed layer being selected from tantalum, molybdenum, niobium, compounds thereof, or combinations thereof; and
 an insulating carrier,
 wherein the first compressively stressed layer is arranged between the insulating carrier and the semiconductor body, the growth substrate being arranged on a surface of the at least one semiconductor layer remote from the first compressively stressed layer.

10. The semiconductor device according to claim 9, wherein the first compressively stressed layer comprises a material selected from tantalum oxide, tantalum nitride, or combinations thereof.

11. The semiconductor device according to claim 9, wherein the first compressively stressed layer has a thickness ranging from 100 nm to 1.5 µm.

12. The semiconductor device according to claim 9, wherein the first compressively stressed layer extends up to an edge region of the semiconductor device.

13. The semiconductor device according to claim 9, further comprising a second compressively stressed layer arranged between the carrier and the first compressively stressed layer.

14. The semiconductor device according to claim 9, wherein the first compressively stressed layer comprises an electrically conductive material, further comprising circuit components arranged within or adjacent to the semiconductor body, wherein the circuit components are electrically connected to the first compressively stressed layer.

15. The semiconductor device according to claim 9, wherein the semiconductor body is configured to emit electromagnetic radiation.

16. The semiconductor device according to claim 9, wherein the first compressively stressed layer comprises an electrically insulating material.

17. The semiconductor device according to claim 16, further comprising a carrier, wherein the first compressively stressed layer is configured to insulate the semiconductor body from the carrier.

18. The method according to claim 1, wherein the separating comprises a plasma dicing process.

19. The method according to claim 5, wherein the second compressively stressed layers comprises a material selected from tantalum, molybdenum, niobium, compounds thereof, or combinations thereof.

20. The method according to claim 5, further comprising a solder layer arranged between the first compressively stressed layer and the second compressively stressed layer.

* * * * *

UNITED STATES PATENT AND TRADEMARK OFFICE
CERTIFICATE OF CORRECTION

| | |
|---|---|
| PATENT NO. | : 11,705,370 B2 |
| APPLICATION NO. | : 17/255435 |
| DATED | : July 18, 2023 |
| INVENTOR(S) | : Benjamin Michaelis et al. |

It is certified that error appears in the above-identified patent and that said Letters Patent is hereby corrected as shown below:

In the Claims

In Column 11, Line 24 (Claim 19), please change "layers" to --layer--

Signed and Sealed this
Twenty-sixth Day of September, 2023

Katherine Kelly Vidal
*Director of the United States Patent and Trademark Office*